United States Patent
Kang et al.

(10) Patent No.: US 8,164,200 B2
(45) Date of Patent: Apr. 24, 2012

(54) STACK SEMICONDUCTOR PACKAGE AND METHOD FOR MANUFACTURING THE SAME

(75) Inventors: Tae Min Kang, Seoul (KR); You Kyung Hwang, Seoul (KR); Jae-hyun Son, Gyeonggi-do (KR); Dae Woong Lee, Gyeonggi-do (KR); Chul Keun Yoon, Gyeonggi-do (KR); Byoung Do Lee, Gyeonggi-do (KR); Yu Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 101 days.

(21) Appl. No.: 12/835,053

(22) Filed: Jul. 13, 2010

(65) Prior Publication Data

US 2011/0121454 A1 May 26, 2011

(30) Foreign Application Priority Data

Nov. 25, 2009 (KR) .................. 10-2009-0114464

(51) Int. Cl.
*H01L 23/48* (2006.01)
(52) U.S. Cl. .............. 257/777; 257/778; 257/E23.169; 257/E21.509; 438/108

(58) Field of Classification Search .................. 257/777, 257/778, E23.169, E21.509; 438/108
See application file for complete search history.

(56) References Cited

U.S. PATENT DOCUMENTS

| 6,388,333 | B1 * | 5/2002 | Taniguchi et al. | 257/777 |
| 6,528,348 | B2 * | 3/2003 | Ando et al. | 438/109 |
| 7,345,361 | B2 | 3/2008 | Mallik et al. | |
| 2006/0220209 | A1 | 10/2006 | Karnezos et al. | |
| 2007/0148822 | A1 | 6/2007 | Haba et al. | |
| 2007/0273049 | A1 * | 11/2007 | Khan et al. | 257/787 |
| 2008/0076208 | A1 | 3/2008 | Wu et al. | |

* cited by examiner

*Primary Examiner* — Trung Q Dang
(74) *Attorney, Agent, or Firm* — Ladas & Parry LLP

(57) ABSTRACT

A stack semiconductor package includes a first insulation member having engagement projections and a second insulation member formed having engagement grooves into which the engagement projections are to be engaged. First conductive members are disposed in the first insulation member and have portions which are exposed on the engagement projections. Second conductive members are disposed in the second insulation member in such a way as to face the first conductive members and have portions which are exposed in the engagement grooves. A first semiconductor chip is disposed within the first insulation member and is electrically connected to the first conductive members. A second semiconductor chip is disposed in the second insulation member and is electrically connected to the second conductive members.

11 Claims, 5 Drawing Sheets

STACK SEMICONDUCTOR PACKAGE AND METHOD FOR MANUFACTURING THE SAME

CROSS-REFERENCE TO RELATED APPLICATIONS

The present application claims priority to Korean patent application number 10-2009-0114464 filed on Nov. 25, 2009, which is incorporated herein by reference in its entirety.

BACKGROUND OF THE INVENTION

The present invention relates generally to a stack semiconductor package and a method for manufacturing the same, and more particularly to a stack semiconductor package having a reduced thickness.

A recent development in the semiconductor industry is a semiconductor package capable of storing and processing a huge amount of data.

Recently, a stack semiconductor package in which at least two semiconductor packages are stacked so as to improve the data storage capacity and the data processing speed of a semiconductor package has been developed.

In order to manufacture such a stack semiconductor package, at least two semiconductor packages are stacked in the vertical direction, and the terminals of the stacked semiconductor packages are connected with one another by means of solder or solder balls so that the semiconductor packages can be electrically connected.

Therefore, when manufacturing the stack semiconductor package according to the conventional art, gaps are inevitably defined between the stacked semiconductor packages due to the presence of the solder or solder balls. As an undesirable consequence, the thickness and the volume of the stack semiconductor package markedly increase due to the gap.

BRIEF SUMMARY OF THE INVENTION

Embodiments of the present invention include a stack semiconductor package having a reduced thickness and volume as compared to a conventional stack package.

Also, embodiments of the present invention include a method for manufacturing a stack semiconductor package.

In an embodiment of the present invention, a stack semiconductor package comprises a first insulation member having engagement projections projecting from a first surface of the first insulation member; a second insulation member disposed on the first surface of the first insulation member and having engagement grooves defined for receiving the engagement projections in a second surface of the second insulation member which faces to the first surface of the first insulation member; first conductive members disposed within the first insulation member, portions of the first conductive members being exposed on the engagement projections; second conductive members disposed within the second insulation member and facing the first conductive members, portions of the second conductive members being exposed in the engagement grooves; a first semiconductor chip disposed within the first insulation member and electrically connected with the first conductive members; and a second semiconductor chip disposed within the second insulation member and electrically connected with the second conductive members.

Portions of at least two first conductive members may be exposed on one engagement projection, and portions of a corresponding number of second conductive members may be exposed in the engagement groove.

The stack semiconductor package may further comprise first ball lands disposed on the first insulation member and connected with the first conductive members; and second ball lands disposed on the second insulation member and connected with the second conductive members.

The stack semiconductor package may further comprise first bonding wires electrically connecting the first ball lands and first bonding pads of the first semiconductor chip; and second bonding wires electrically connecting the second ball lands and second bonding pads of the second semiconductor chip.

The stack semiconductor package may further comprise a substrate having a substrate body onto which the second insulation member is mounted, connection pads which are disposed on an upper surface of the substrate body and are electrically connected with the second conductive members, and substrate ball lands which are disposed on a lower surface of the substrate body, facing away from the upper surface, and are electrically connected with the connection pads.

The stack semiconductor package may further comprise an additional substrate covering the first insulation member.

The first and second conductive members may have a column-like shape or a sphere-like shape.

In an embodiment of the present invention, a method for manufacturing a stack semiconductor package comprises the steps of producing preliminary semiconductor packages through preparing a substrate having ball lands which are disposed adjacent to edges of a substrate, attaching a semiconductor chip having bonding pads onto the substrate, connecting the ball lands of the substrate and bonding pads of the semiconductor chip with bonding wires, mounting conductive members onto the ball lands, and forming an insulation member by depositing an insulation material on the substrate to cover the conductive members; preparing a first semiconductor package by defining engagement grooves in the insulation member and the conductive members of a first preliminary semiconductor package, such that portion of the conductive members are exposed from the insulation member; preparing a second semiconductor package by defining engagement projections in the insulation member and the conductive members of a second preliminary semiconductor package, such that portions of the conductive members are exposed from the insulation member at positions corresponding to the engagement grooves of the first semiconductor package; and engaging the engagement projections and the engagement grooves such that the conductive members of the first and second semiconductor packages are electrically connected.

After the step of electrically connecting the conductive members of the first and second semiconductor packages, the method may further comprise the step of removing the substrate attached to the first semiconductor package, from the first semiconductor package.

The step of forming the preliminary semiconductor packages may comprise the step of connecting electrically the ball lands and the semiconductor chip by means of bonding wires.

The engagement projections may be formed in a column-like shape, and the engagement grooves may be defined in a shape to be engaged with the engagement projections.

DESCRIPTION OF SPECIFIC EMBODIMENTS

Figures 1, 2:
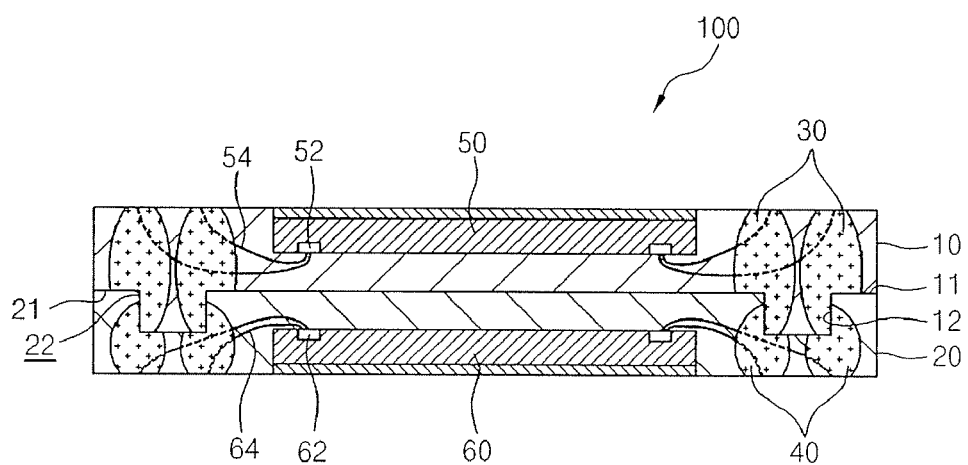
FIG. 1 is a cross-sectional view showing a stack semiconductor package in accordance with an embodiment of the present invention.
FIG. 2 is a cross-sectional view showing a stack semiconductor package in accordance with an embodiment of the present invention.

Hereafter, specific embodiments of the present invention will be described in detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a cross-sectional view showing a stack semiconductor package in accordance with an embodiment of the present invention.

Referring to FIG. 1, a stack semiconductor package 100 includes a first insulation member 10, a second insulation member 20, first conductive members 30, second conductive members 40, a first semiconductor chip 50, and a second semiconductor chip 60.

The first insulation member 10 may have a plate-like shape, although the present invention is not limited hereto. The first insulation member 10 has engagement projections 12 which project by a predetermined height from a first surface 11 of the first insulation member 10. According to an embodiment, the engagement projections 12 have, for example, a column-like shape. The engagement projections 12 have a quadrangular or circular column-like shape. The engagement projections 12 are disposed in a plural number along and adjacent to the edges of the first insulation member 10.

The first insulation member 10 having the plate-like shape may contain an insulation material, for example, such as epoxy resin.

The second insulation member 20 may have a plate-like shape. A second surface 21 of the second insulation member 20 faces the first surface 11 of the first insulation member 10. The second insulation member 20 has engagement grooves 22 which are defined to be recessed from the second surface 21 of the second insulation member 20.

In the embodiment, the engagement grooves 22 have a depth that corresponds to the height of the engagement projections 12 projecting from the first surface 11 of the first insulation member 10. Due to this fact, the engagement projections 12 can be fitted into the engagement grooves 22, and therefore reduce or eliminate gaps in a stack package. That is, as the engagement projections 12 are fitted into the engagement grooves 22, the first surface 11 of the first insulation member 10 and the second surface 21 of the second insulation member 20 contact each other with substantially no gap defined therebetween.

The first conductive members 30 can have, for example, a column-like shape or a sphere-like shape. According to an embodiment, the first conductive member 30 may include solders. The first conductive members 30 are disposed in the first insulation member 10, and portions of the first conductive members 30 are exposed in the engagement projections 12. In detail, in an embodiment, the first conductive members 30 are exposed on the first surface 11 of the first insulation member 10 and on side surfaces of the engagement projections 12. Portions of at least two first conductive members 30 can be exposed by a single engagement projection 12 of the first insulation member 10 as shown in FIG. 1.

The second conductive members 40 have a column-like shape or a sphere-like shape. In an embodiment, the second conductive members 40 can include solders.

The second conductive members 40 are disposed in the second insulation member 20 at positions corresponding to the first conductive members 30. Portions of the second conductive members 40 are exposed in the engagement grooves 22.

In detail, the second conductive members 40 can be exposed at surfaces of the second insulation member 20 which define the engagement grooves 22.

At least two second conductive members 40 can be exposed by a single engagement groove 22 defined in the second insulation member 20 as shown in FIG. 1.

The first semiconductor chip 50 is disposed within the first insulation member 10 in a face-down configuration such that first bonding pads 52 face downward toward the first surface of the first insulation member 11. The first semiconductor chip 50 may include a circuit unit (not shown) which has a data storage section (not shown) for storing data and/or a data processing section (not shown) for processing data.

The first bonding pads 52 of the first semiconductor chip 50 are electrically connected with the first conductive members 30. In an embodiment, the first bonding pads 52 of the first semiconductor chip 50 and the first conductive members 30 can be electrically connected by means of, for example, first bonding wires 54.

The second semiconductor chip 60 is disposed within the second insulation member 20 in a face-up configuration such that second bonding pads 62 face upwards toward the second surface of the second insulation member 21. The second semiconductor chip 60 may include a circuit unit (not shown) which has a data storage section (not shown) for storing data and/or a data processing section (not shown) for processing data.

While the engagement projections 12 and the engagement grooves 22 are described above to be engaged with each other and formed and defined on the facing surfaces 11 and 21 of the first and second insulation members 10 and 20, respectively, it should be understood that engagement projections and/or engagement grooves can be formed and defined on the surfaces opposite the surfaces 11 and 21 of the first and second insulation members 10 and 20.

The second bonding pads 62 of the second semiconductor chip 60 are electrically connected with the second conductive members 40. In an embodiment, the second bonding pads 62 of the second semiconductor chip 60 and the second conductive members 40 may be electrically connected by means of, for example, second bonding wires 64, although it should be understood that the present invention is not limited in this regard.

FIG. 2 is a cross-sectional view showing a stack semiconductor package in accordance with an embodiment of the present invention. The stack semiconductor package shown in FIG. 2 is substantially the same as the stack semiconductor package described above with reference to FIG. 1, except for the addition of ball lands and connection members. Therefore, repeated description for the same component parts will be omitted herein, and the same technical terms and the same reference numerals will be used to refer to the same component parts.

Referring to FIG. 2, a stack semiconductor package 100 includes a first insulation member 10, a second insulation member 20, first conductive members 30, second conductive members 40, a first semiconductor chip 50, a second semiconductor chip 60, first ball lands 72, and second ball lands 74.

The first ball lands 72 are disposed on the first conductive members 30, and according to an embodiment, the first ball lands 72 may include copper. The first ball lands 72 may also further include a gold layer and/or a nickel layer. In an embodiment, the first ball lands 72 can be formed in the shape of a circular plate, although the present invention is not limited hereto.

The second ball lands 74 are disposed on the second conductive member 40, and according to an embodiment, the second ball lands 74 may include copper. The second ball lands 74 may also further include a gold layer and/or a nickel layer.

As shown in FIG. 2, connection members 76 and 78 can be disposed on the first ball lands 72 and the second ball lands 74. The connection members 76 and 78 may comprise solder balls or the like. Other semiconductor chips can be additionally disposed on the first ball lands 72 and/or the second ball lands 74 by connection members 76 and 78.

Figure 3:
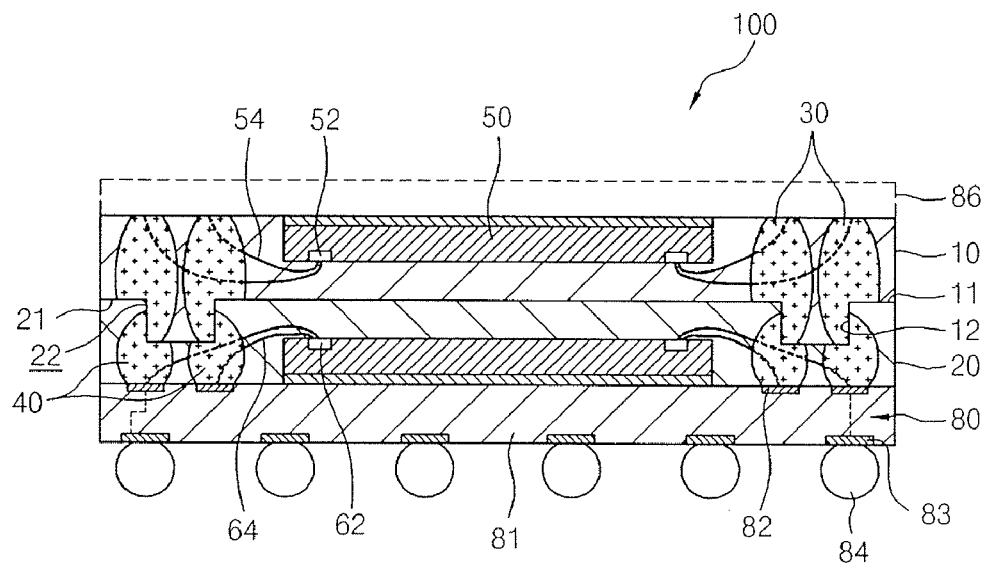
FIG. 3 is a cross-sectional view showing a stack semiconductor package in accordance with an embodiment of the present invention.

FIG. 3 is a cross-sectional view showing a stack semiconductor package in accordance with an embodiment of the present invention. The stack semiconductor package shown in FIG. 3 is substantially the same as the stack semiconductor package described above with reference to FIG. 1, except for the addition of a substrate. Therefore, repeated description for the same component parts will be omitted herein, and the same technical terms and the same reference numerals will be used to refer to the same component parts.

Referring to FIG. 3, a stack semiconductor package 100 includes a first insulation member 10, a second insulation member 20, first conductive members 30, second conductive members 40, a first semiconductor chip 50, a second semiconductor chip 60, and a substrate 80.

The substrate 80 includes a substrate body 81, connection pads 82, substrate ball lands 83, and solder balls 84.

The substrate body 81 may have, for example, a plate-like shape. The second insulation member 20 is disposed over the upper surface of the substrate body 81.

Connection pads 82 are disposed on the upper surface of the substrate body 81 at positions corresponding to the second conductive members 40, which are disposed within the second insulation member 20, such that the second conductive members 40 and the connection pads 82 are electrically connected with each other.

Substrate ball lands 83 are disposed on the lower surface of the substrate body 81, which faces away from the upper surface, and are electrically connected with the connection pads 82.

Solder balls 84 are disposed on the substrate ball lands 83 so as to be electrically connected with the substrate ball lands 83.

While it was illustrated and described in the embodiment that the second insulation member 20 is disposed on the substrate 80, it should be understood that an additional substrate 86 may be disposed on the first insulation member 10 so that an embedded package can be realized.

FIGS. 4 through 9 are cross-sectional views shown for illustrating a method for manufacturing a stack semiconductor package in accordance with an embodiment of the present invention.

Figure 4:
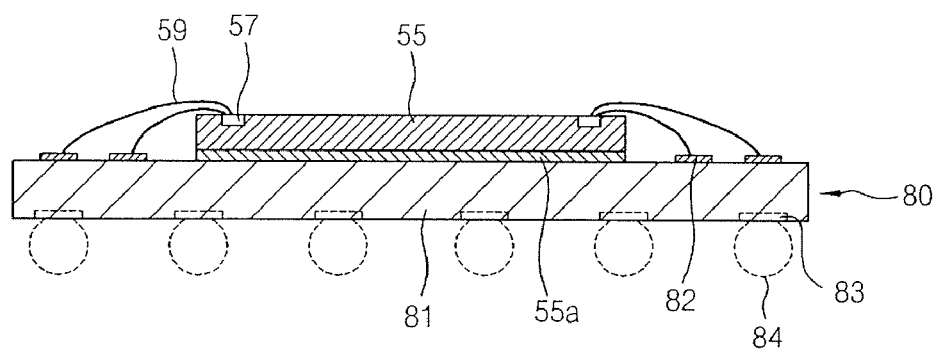
FIGS. 4 through 9 are cross-sectional views shown for illustrating a method for manufacturing a stack semiconductor package in accordance with another embodiment of the present invention.
Figure 5:
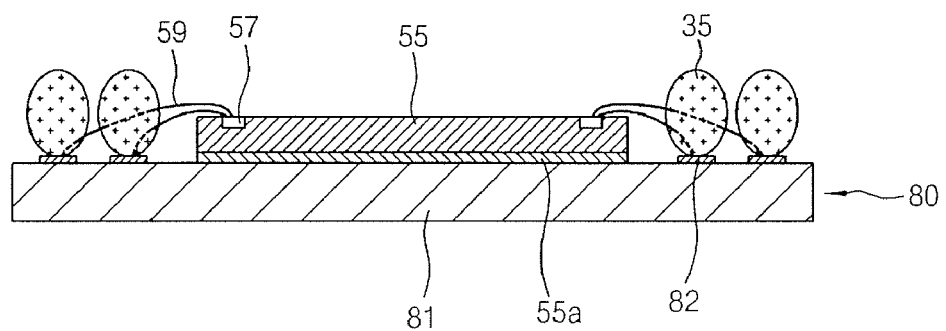
Figure 6:
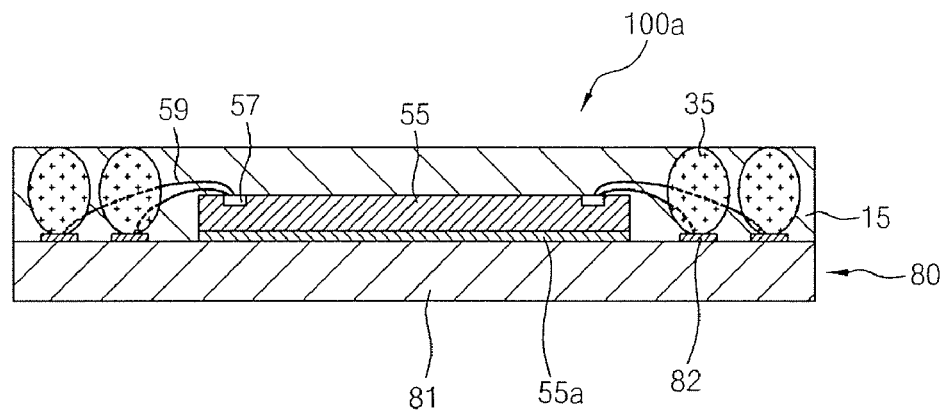

FIGS. 4 through 6 are cross-sectional views shown illustrating processes for manufacturing a preliminary semiconductor package to be used for the manufacture of a stack semiconductor package.

Referring to FIG. 4, in order to manufacture a preliminary semiconductor package, a substrate 80 is prepared. In an embodiment, the substrate 80 may comprise a printed circuit board or the like. Alternatively, the substrate 80 may comprise a synthetic resin substrate, a glass substrate, etc. The reference numeral 81 designates a substrate body.

A semiconductor chip 55 is attached the upper surface of the substrate 80, for example a central portion of the upper surface of the substrate 80, using an adhesive 55a, for example an adhesive tape. Bonding pads 57 are disposed on the upper surface of the semiconductor chip 55, and one or more ball lands 82 are disposed along and adjacent to the edges of the substrate 80. For example, at least two ball lands 82 can be disposed adjacently as shown in FIG. 4. In addition, substrate ball lands 83 can be provided on the lower surface of the substrate 80, which faces away from the upper surface, in such a way as to be electrically connected with the ball lands 82, and solder balls 84 can be attached to the substrate ball lands 83. The ball lands 82 have a structure capable of being attached to and detached from the substrate 80.

The ball lands 82 of the substrate 80 and the bonding pads 57 of the semiconductor chip 55 are, for example, wire-bonded by bonding wires 59.

Referring to FIG. 5, after the ball lands 82 and the bonding pads 57 are wire-bonded, conductive members 35 are mounted to the ball lands 82. The conductive members 35 include, for example, solders. The conductive members 35 may have a sphere-like shape or a column-like shape.

Referring to FIG. 6, after the conductive members 35 are mounted to the ball lands 82, an insulation member 15 is formed on the substrate 80. In the embodiment, the insulation member 15 encapsulates the semiconductor chip 55, the conductive members 35, and the bonding wires 59, by which a preliminary semiconductor package 100a is formed. In an embodiment, the insulation member 15 may comprise, for example, epoxy resin.

Figure 7:
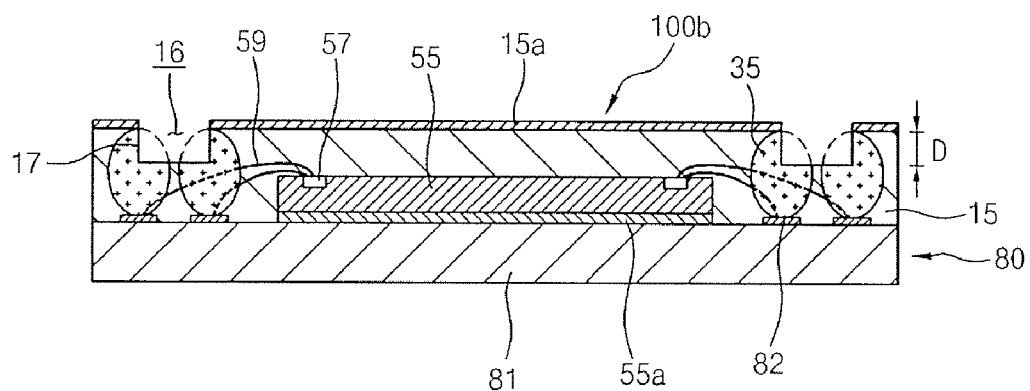

Referring to FIG. 7, a mask pattern 15a is formed on the upper surface of the insulation member 15 after a preliminary semiconductor package 100a is formed. For example, the mask pattern 15a has openings 16, which expose portions of the conductive members 35, and covers the entire remaining surface of the insulation member 15. The openings 16 are defined, for example, at positions corresponding to the conductive members 35. More specifically, each opening 16 is disposed between adjoining conductive members 35 so as to expose a portion of each of the adjoining conductive members 35, and the opening 16 has an area less than the area occupied by the adjoining conductive members 35 when viewed from the top.

Then, by etching the insulation member 15 and portions of the conductive members 35 exposed through the openings 16 of the mask pattern 15a, engagement grooves 17 are defined to a predetermined depth D from the surface of the insulation member 15, by which a first semiconductor package 100b is manufactured.

The conductive members 35 are exposed at a bottom surfaces and sidewalls of the insulation member 15 which define of the engagement grooves 17.

Alternatively, while not shown in a drawing, the engagement grooves 17 through other known processes, for example the engagement grooves 17 may be defined through conducting a laser drilling process. In detail, after placing a laser drilling device (not shown) over the insulation member 15 including the mask pattern 15a, the engagement grooves 17 are defined by selectively removing portions the insulation member 15 and the conductive members 35 exposed through the mask pattern 15a to the predetermined depth D when measured from the surface of the insulation member 15, using the laser drilling device.

Figure 8:
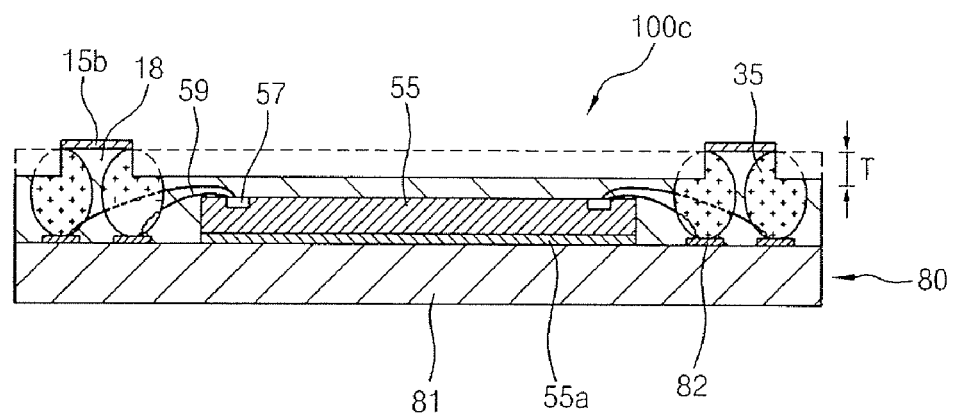

Referring to FIG. 8, mask patterns 15b are formed on the upper surface of the insulation member 15 after a preliminary semiconductor package 100a is formed. The mask patterns 15b are formed, for example, at positions corresponding to the engagement grooves 17 of the first semiconductor package 100b. In detail, each mask pattern 15b is disposed between a pair of adjoining conductive members 35. The mask pattern 15b has an area less than the area occupied by the adjoining conductive members 35 when viewed from the top.

Then, engagement projections 18, which are to be engaged into the engagement grooves 17 of the first semiconductor package 100b, are formed by etching the insulation member 15 and the conductive members 35 by a predetermined thickness T using the mask patterns 15b as etch masks, by which a second semiconductor package 100c is manufactured. In an embodiment, the engagement projections 18 can be formed, for example, into a column-like shape.

Alternatively, while not shown in a drawing, the engagement projections 18 can be formed through other known processes, for example, by conducting a grinding process. In detail, a grinding device (not shown) is placed over the insulation member 15 formed with the mask patterns 15b. For instance, the grinding pad of the grinding device has a circular sectional shape when viewed from the top. In particular, the grinding pad having a circular sectional shape has an area less than the area of the semiconductor chip 55.

The engagement projections 18, which are to be engaged into the engagement grooves 17 of the first semiconductor package 100b, are formed by selectively grinding the insulation member 15 and the conductive members 35 exposed between the mask patterns 15b by the predetermined thickness T using the grinding pad having the area less than the area of the semiconductor chip 55.

Figure 9:
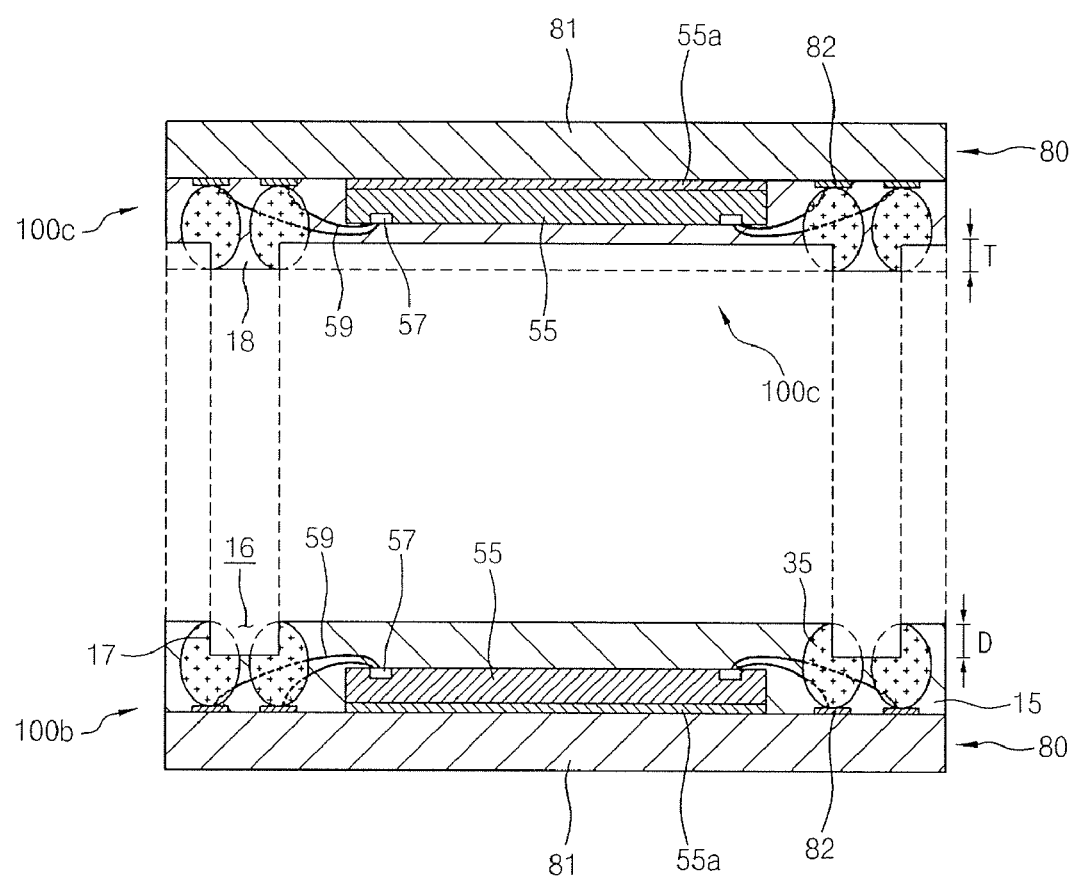

Referring to FIG. 9, after the first and second semiconductor packages 100b and 100b are manufactured, the first and second semiconductor packages 100b and 100c are oriented such that the engagement grooves 17 of the first semiconductor package 100b and the engagement projections 18 of the second semiconductor package 100c are aligned and face each other. Then, the engagement projections 18 are respectively engaged into the engagement grooves 17 by coupling the first and second semiconductor packages 100b and 100c. Then, a reflow process is conducted to electrically connect the conductive members 35 of the first semiconductor package 100b and the conductive members 35 of the second semiconductor package 100c, and through this the stack semiconductor package shown in FIG. 1 is manufactured.

After the stack semiconductor package is manufactured by coupling the first and second semiconductor packages 100b and 100c, at least one of the substrates 80 included in the first and second semiconductor packages 100b and 100c can be removed from the stack semiconductor package.

As is apparent from the above description, the stack semiconductor package and the method for manufacturing the same according to the present invention provide advantages in that, since the terminals of one semiconductor package form engagement projections which project from an insulation member and the terminals of another semiconductor package define engagement grooves which are recessed into an insulation member, the engagement projections and the engagement grooves can be engaged with each other substantially without a gap defined between the semiconductor packages, whereby the thickness and the volume of a stack semiconductor package can be significantly reduced.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stack semiconductor package comprising:
   a first insulation member having engagement projections projecting from a first surface of the first insulation member;
   first conductive members disposed within the first insulation member, portions of the first conductive members being exposed on the engagement projections;
   a second insulation member disposed on the first surface of the first insulation member and having engagement grooves defined for receiving the engagement projections in a second surface of the second insulation member which faces to the first surface of the first insulation member;
   second conductive members disposed within the second insulation member and facing the first conductive members, wherein portions of the second conductive members are exposed in the engagement grooves;
   a first semiconductor chip disposed within the first insulation member and electrically connected to the first conductive members; and
   a second semiconductor chip disposed within the second insulation member and electrically connected to the second conductive members.

2. The stack semiconductor package according to claim 1, wherein portions of at least two first conductive members are exposed on a single engagement projection, and portions of a corresponding number of second conductive members are exposed in the engagement groove.

3. The stack semiconductor package according to claim 1, further comprising:
   first ball lands disposed on the first insulation member and connected to the first conductive members; and
   second ball lands disposed on the second insulation member and connected to the second conductive members.

4. The stack semiconductor package according to claim 3, further comprising:
   first bonding wires electrically connecting the first ball lands to first bonding pads of the first semiconductor chip; and
   second bonding wires electrically connecting the second ball lands to second bonding pads of the second semiconductor chip.

5. The stack semiconductor package according to claim 1, further comprising:
a substrate comprising:
a substrate body onto which the second insulation member is mounted;
connection pads disposed on a first surface of the substrate body and electrically connected to the second conductive members; and
substrate ball lands disposed on a second surface of the substrate body, facing away from the first surface, and electrically connected to the connection pads.

6. The stack semiconductor package according to claim 5, further comprising:
an additional substrate covering the first insulation member.

7. The stack semiconductor package according to claim 1, wherein the first and second conductive members have a column-like shape or a sphere-like shape.

8. A method for manufacturing a stack semiconductor package, comprising:
producing preliminary semiconductor packages through preparing a substrate having ball lands which are disposed along and adjacent to edges of the substrate, attaching a semiconductor chip having bonding pads onto the substrate, connecting the ball lands of the substrate and bonding pads of the semiconductor chip with bonding wires, mounting conductive members onto the ball lands, and forming an insulation member by depositing an insulation material on the substrate to cover the conductive members;
preparing a first semiconductor package by defining engagement grooves in the insulation member and the conductive members of a first preliminary semiconductor package, such that portions of the conductive members are exposed from the insulation member;
preparing a second semiconductor package by defining engagement projections in the insulation member and the conductive members of a second preliminary semiconductor package, such that portions of the conductive members are exposed from the insulation member at positions corresponding to the engagement grooves of the first semiconductor package; and
engaging the engagement projections and the engagement grooves such that the conductive members of the first and second semiconductor packages are electrically connected.

9. The method according to claim 8, wherein, the method further comprises:
removing the substrate attached to the first semiconductor package, after electrically connecting the conductive members of the first and second semiconductor packages.

10. The method according to claim 8, wherein forming the preliminary semiconductor packages comprises:
electrically connecting the ball lands and the semiconductor chip with bonding wires.

11. The method according to claim 8, wherein the engagement projections are formed in a column-like shape, and the engagement grooves are defined in a corresponding shape to be engaged with the engagement projections.

* * * * *